(12) United States Patent
Mozak et al.

(10) Patent No.: US 9,374,004 B2
(45) Date of Patent: Jun. 21, 2016

(54) I/O DRIVER TRANSMIT SWING CONTROL

(71) Applicant: Intel Corporation, Santa Clara, CA (US)

(72) Inventors: Christopher P. Mozak, Beaverton, OR (US); Ritesh B. Trivedi, Folsom, CA (US); James A. McCall, Portland, OR (US); Aaron Martin, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 302 days.

(21) Appl. No.: 13/931,604

(22) Filed: Jun. 28, 2013

(65) Prior Publication Data

US 2015/0002408 A1    Jan. 1, 2015

(51) Int. Cl.
*H03K 19/0175* (2006.01)
*H03K 19/0185* (2006.01)
*H02M 3/158* (2006.01)
*G11C 29/02* (2006.01)
*G11C 7/10* (2006.01)
*H04L 25/02* (2006.01)

(52) U.S. Cl.
CPC .............. *H02M 3/158* (2013.01); *G11C 7/1057* (2013.01); *G11C 29/022* (2013.01); *G11C 29/025* (2013.01); *G11C 29/028* (2013.01); *H04L 25/029* (2013.01); *H04L 25/0276* (2013.01); *G11C 2207/105* (2013.01)

(58) Field of Classification Search
CPC .............. H03K 19/018521; H03K 19/018571; H03K 19/00384; H03K 19/017509
USPC ................................................. 326/82, 83, 80
See application file for complete search history.

(56) References Cited

U.S. PATENT DOCUMENTS

| | | | |
|---|---|---|---|
| 4,491,930 A | | 1/1985 | Hyatt |
| 5,568,062 A | * | 10/1996 | Kaplinsky ...................... 326/27 |
| 6,522,174 B2 | | 2/2003 | Martin et al. |
| 6,643,339 B1 | | 11/2003 | Okanoue et al. |
| 6,774,678 B2 | | 8/2004 | Martin et al. |
| 6,847,617 B2 | | 1/2005 | Borkar et al. |

(Continued)

FOREIGN PATENT DOCUMENTS

| | | |
|---|---|---|
| KR | 10-2009-0117165 | 11/2009 |
| KR | 10-20080043080 | 11/2009 |
| KR | 1009913830000 | 7/2010 |

OTHER PUBLICATIONS

Office Action from U.S. Appl. No. 14/018,217, mailed Aug. 11, 2014, 13 pages.

(Continued)

*Primary Examiner* — Daniel D Chang
(74) *Attorney, Agent, or Firm* — Blakely, Sokoloff, Taylor & Zafman LLP

(57) ABSTRACT

A transmission line interface circuit includes a voltage regulator to control a voltage swing of the transmission line interface circuit for signal transmission. The transmission line interface circuit includes complementary driver elements, including a p-type driver element to pull up the transmission line in response to a logic high, and an n-type driver element to pull down the transmission line in response to a logic low. The voltage regulator is coupled between one of the driver elements and a respective voltage reference to reduce a voltage swing of the transmission line interface circuit.

18 Claims, 9 Drawing Sheets

(56) References Cited

U.S. PATENT DOCUMENTS

| | | | |
|---|---|---|---|
| 6,894,536 | B2 | 5/2005 | Martin et al. |
| 7,155,006 | B2 | 12/2006 | Casper et al. |
| 7,272,707 | B2 | 9/2007 | Liu et al. |
| 7,602,056 | B2 | 10/2009 | Zhao et al. |
| 7,624,225 | B2 | 11/2009 | Gower et al. |
| 7,627,730 | B1 | 12/2009 | Moll |
| 7,647,467 | B1 | 1/2010 | Hutsell et al. |
| 7,886,174 | B2 | 2/2011 | Spry et al. |
| 7,898,295 | B1 | 3/2011 | Kasturirangan et al. |
| 7,979,039 | B2 | 7/2011 | Sumesaglam et al. |
| 8,045,663 | B2 | 10/2011 | Bae et al. |
| 8,331,176 | B2 | 12/2012 | Mozak et al. |
| 8,335,894 | B1 | 12/2012 | Rajan et al. |
| 8,819,474 | B2 | 8/2014 | Schoenborn et al. |
| 8,868,992 | B2 | 10/2014 | Spry et al. |
| 8,988,106 | B2 * | 3/2015 | Chen .................. H03K 19/094 326/82 |
| 8,996,934 | B2 | 3/2015 | Mozak et al. |
| 9,003,246 | B2 | 4/2015 | Mozak et al. |
| 9,009,531 | B2 | 4/2015 | Mozak et al. |
| 9,009,540 | B2 | 4/2015 | Mozak et al. |
| 2006/0056305 | A1 | 3/2006 | Oksman et al. |
| 2006/0059392 | A1 | 3/2006 | Kizer et al. |
| 2007/0245177 | A1 | 10/2007 | Cooper et al. |
| 2008/0130811 | A1 | 6/2008 | Bae et al. |
| 2008/0235444 | A1 | 9/2008 | Gower et al. |
| 2009/0115448 | A1 | 5/2009 | Abadeer et al. |
| 2009/0244997 | A1 | 10/2009 | Searles et al. |
| 2010/0014567 | A1 | 1/2010 | Yamamoto |
| 2010/0127736 | A1 | 5/2010 | Dixit et al. |
| 2011/0022870 | A1 | 1/2011 | McGrane et al. |
| 2011/0110409 | A1 | 5/2011 | Sands et al. |
| 2011/0141827 | A1 | 6/2011 | Mozak et al. |
| 2011/0307671 | A1 | 12/2011 | Fox et al. |
| 2012/0087194 | A1 | 4/2012 | Oh et al. |
| 2012/0243364 | A1 | 9/2012 | Hacking |
| 2013/0058145 | A1 | 3/2013 | Yu et al. |
| 2013/0313709 | A1 | 11/2013 | Hinck et al. |
| 2013/0346721 | A1 | 12/2013 | Giovannini et al. |
| 2014/0145760 | A1 * | 5/2014 | Nguyen et al. .................. 326/82 |
| 2014/0184523 | A1 | 7/2014 | McCall et al. |
| 2014/0189293 | A1 | 7/2014 | Gopal et al. |
| 2014/0266320 | A1 | 9/2014 | Conrow et al. |

OTHER PUBLICATIONS

Notice of the International Search Report in related PCT Application No. PCT/US2014/043285 mailed Oct. 27, 2014, 5 pages.

Notice of the Written Opinion in related PCT Application No. PCT/US2014/043285 mailed Oct. 27, 2014, 9 pages.

Corrigan, Steve, "Skew Definition and Jitter Analysis", Published Feb. 2000, *Analog Applications Journal*, <http:www.ti.com/lit/an/slyt179.pdf>.

Kin, Kenrick, et al., "Determining the Benefits of Direct-Touch, Bimanual, and Multifinger Input on A Multitouch Workstation", *Proceedings of Graphics Interface Processing Society 2009, Canidian Information Processing Society 2009*.

* cited by examiner

FIG. 1A – PRIOR ART

I/O DRIVER TRANSMIT SWING CONTROL

FIELD

Embodiments of the invention are generally related to inter-device communication, and more particularly to swing control for an inter-device communication driver.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2013, Intel Corporation, All Rights Reserved.

BACKGROUND

Communication between components on a host platform is necessary for operation of an electronic device. However, communication involves the use of output line or transmission line drivers, which consumes a significant amount of total power used within electronic devices. For example, the communication between the processor and memory, between a memory controller and the processor, between a memory controller and a memory device, between a peripheral controller and a processor or memory subsystem, or other communication, consumes significant amounts of power. In general, the communication among different components can be referred to as I/O (input/output), and is frequently governed by standards (e.g., between components of a memory subsystem). The I/O standards can relate to performance characteristics for I/O power, I/O latency, and I/O frequency. The standards or nominal values of I/O performance settings are set to values that can be achieved across different systems for compatibility and interoperability.

FIG. 1A is a block diagram of a known CMOS output driver. The known CMOS (complementary metal-oxide semiconductor) output driver 134 is a common design for I/O systems. System 102 includes transmitter 110, which communicates with receiver 120. It will be understood that transmitter 110 will be a receiving device when receiver 120 drives communication to transmitter 110. Thus, the roles of transmitting device and receiving device can be reversed, and output driver 134 is illustrated as part of transceiver 130. However, for purposes of discussion herein, the primary focus is on transmission of the signal rather than reception of the signal. For purposes of transmission of a signal from transmitter 110 to receiver 120, receiver 120 can be modeled as a load impedance R122. Transmitter 110 drives transmission line 154 for receiver 120 to receive, by pulling transmission line 154 up to VDD via pull-up (PU) element 140, and pulling transmission line 154 down to VSS via pull-down (PD) element 142. Output impedance R146 is typically matched to the impedance of pad 152 and transmission line 154 as seen by driver 134. Predriver 132 provides signaling and control to driver 134 to output a signal on transmission line 154. Pad 152 interfaces transmitter device 110 to transmission line 154.

An example of use of system 102 is for a driver in LPDDR3 (low power dual data rate version 3, initial specification published in May 2012 by JEDEC). System 102 results in a full swing of the output voltage to drive an output signal. Components other than those of memory subsystems can also use a driver that results in a full swing of the output voltage. The full swing of the output voltage uses a significant amount of power for I/O (input/output) or interfacing between components.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 1A is a block diagram of a known CMOS output driver.

Figure 1B:
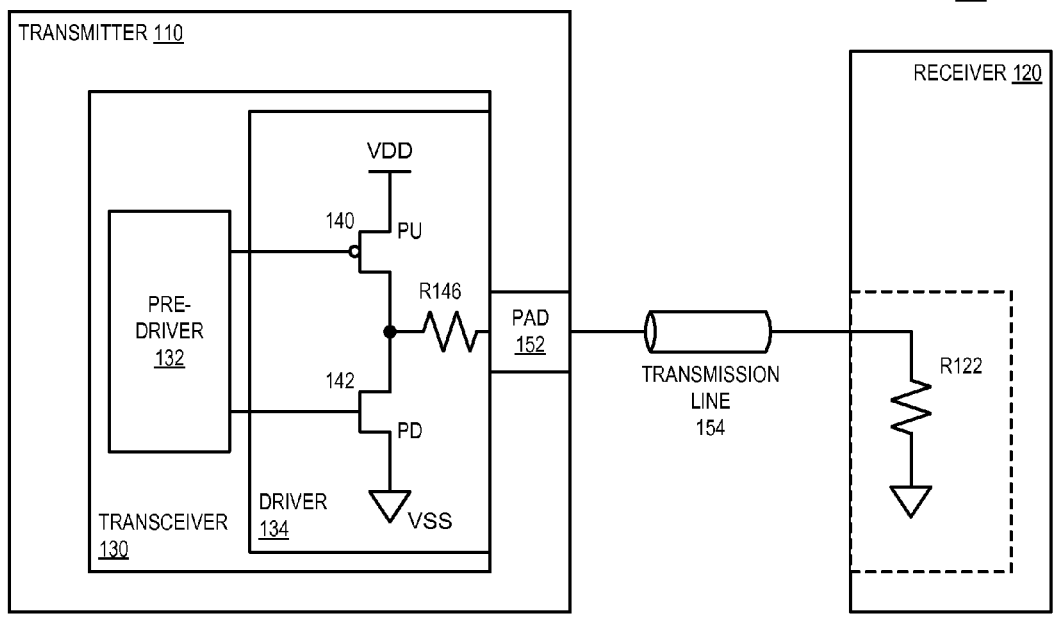
FIG. 1B is a block diagram of a dual-NMOS output driver.
Figure 1B:
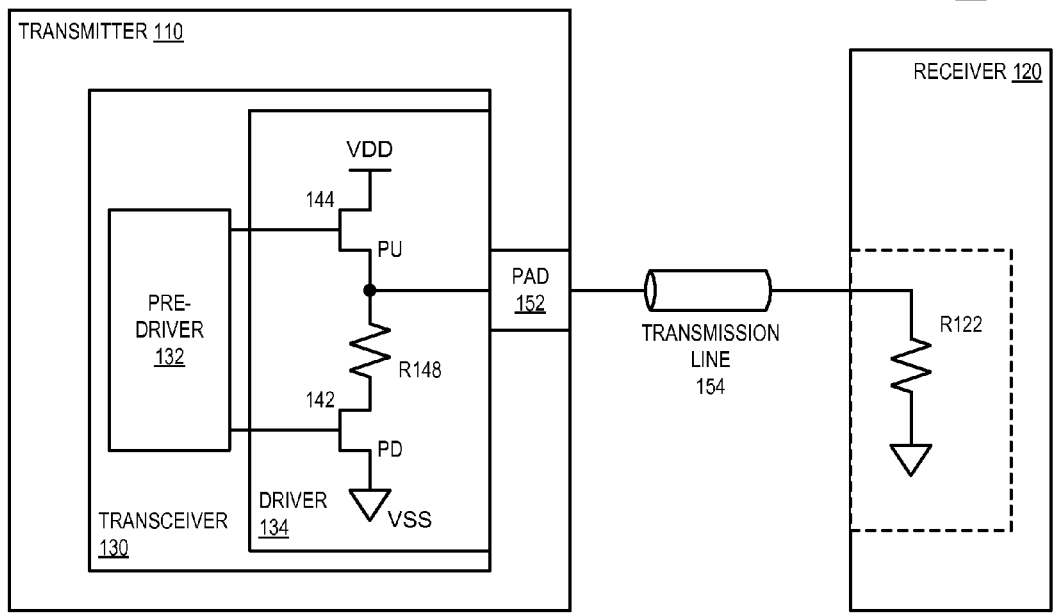

Descriptions of certain details and implementations follow, including a description of the figures, which may depict some or all of the embodiments described below, as well as discussing other potential embodiments or implementations of the inventive concepts presented herein.

DETAILED DESCRIPTION

As described below, a voltage regulator controls a voltage swing of a transmission line interface circuit for signal transmission. The transmission line interface circuit is or is part of the driver that drives the transmission line. The transmission line interface circuit includes complementary driver elements, including a p-type driver element to pull up the transmission line in response to a logic high, and an n-type driver element to pull down the transmission line in response to a logic low. A voltage regulator is coupled between one of the driver elements and a respective voltage reference to reduce a voltage swing of the transmission line interface circuit. In one embodiment, voltage regulators are used both in the pull-up leg and the pull-down leg of the transmission line interface circuit. Thus, a first voltage regulator can be placed between the high voltage source (VDD) and the pull-up element, and a second voltage regulator can be placed between the low voltage source or ground (VSS) and the pull-down element. The reduced voltage swing can be made to comply with I/O (input/output) interface standards, while reducing an amount of power used within a system for I/O transmit.

In one embodiment, operation of the transmission line interface circuit can be further controlled via the use of empirical testing. A system can empirically test performance parameters of device I/O (input/output) for a specific device. Based on the empirical testing via a test system, the system can set the performance parameters specific to the system or device in which the inter-device communication takes place. For each of multiple different settings for multiple different I/O circuit parameters, the test system sets a value for each I/O circuit parameter, generates test traffic to stress test the communication with the parameter value(s), and measures an operating margin for the I/O performance characteristic. The circuit parameters can include Vref, Ron, slew rate, on-die termination (ODT), regulator output voltage, and/or other parameters. The test system further executes a search function to determine values for each I/O circuit parameter at which the operating margin meets a minimum threshold and performance of at least one of the I/O circuit parameters is increased. In one embodiment, the system sets runtime values for the I/O circuit parameters based on the search function. The settings can be dynamically changed for specific components of specific systems based on testing.

In one embodiment, the test system or test engine described can be used to test memory subsystems, and more specifically, the communication between a platform component (e.g., a processor, a memory controller) and a memory device. Any memory subsystem that uses a memory controller with a scheduler or equivalent logic can implement at least one embodiment of a test engine. Reference made herein to memory devices can include different memory types. For example, memory subsystems commonly use DRAM, which is one example of a memory device as described herein. Thus, the test engine described herein is compatible with any of a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR4 (low power dual data rate version 4, specification in development by JEDEC as of the filing of this application), WIDEIO (specification in development by JEDEC as of the filing of this application), and/or others, and technologies based on derivatives or extensions of such specifications.

FIG. 1B is a block diagram of a known dual-NMOS output driver. System 104 is similar to system 102 of FIG. 1A, but with an n-type pull-up element 144 and an n-type pull-down element 142. The swing of the output signals is lower in system 104 than in system 102, because the n-type pull-up element or device has a threshold voltage needed to turn on element 144, which reduces the output swing over using a complementary driver design. Elements 110, 120, R122, 130, 132, 134, 152, and 154 are the same as in system 104, except as stated. Output impedance R148 is typically designed to match the impedance of pad 152 and transmission line 154 as seen by driver 134.

An example of a use of system 104 is for a driver for LPDDR4, which proposes a design like system 104. System 102 results in a full swing of the output voltage to drive an output signal, which uses higher power than system 104. However, system 104 increases padcap (pad capacitance), and requires a different slew rate control than what is used in system 102. Thus, an interface system cannot easily connect an LPDDR3 driver for legacy device support onto the same pad connected to an LPDDR4 driver. Additionally, the design of system 104 results in pullup voltage and Ron (output impedance) values that are not well controlled across PVT (process, voltage, and temperature). Additionally, the pullup voltage and Ron are difficult to compensate in system 104.

Figure 2:
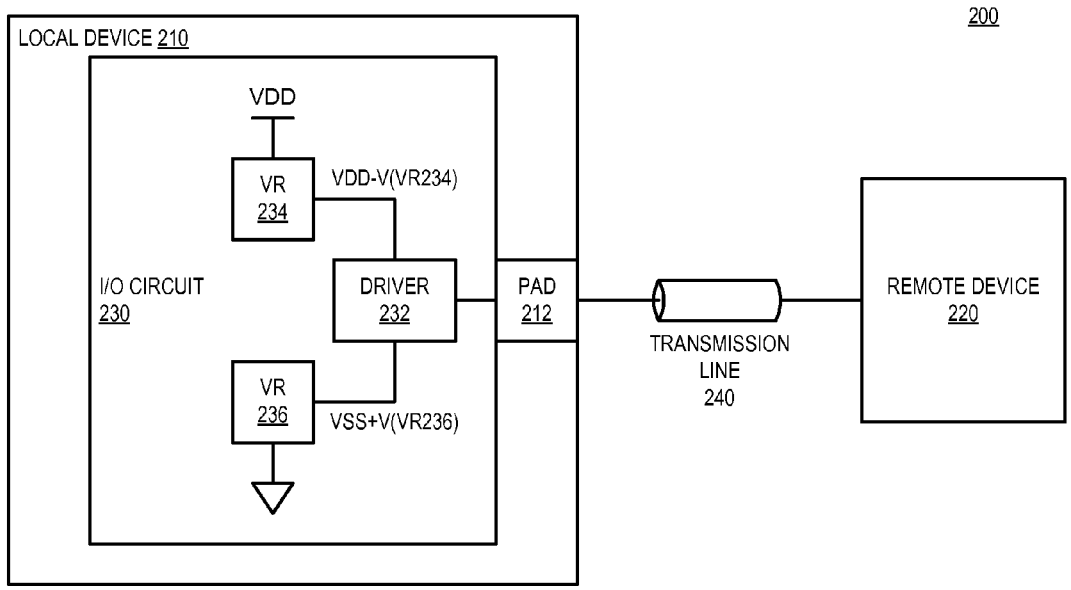
FIG. 2 is a block diagram of an embodiment of a system having a voltage regulator to reduce transmit swing.

FIG. 2 is a block diagram of an embodiment of a system having a voltage regulator to reduce swing on I/O transmission. System 200 includes local device 210, which communicates with remote device 220. The primary focus of discussion for system 200 is with respect to transmission of a signal from local device 210 to remote device 220. Local device 210 is "local" to the transmission line interface circuit that drives transmission line 240 on transmit. Thus, for transmit from device 210 to device 220, remote device 220 is remote from the transmission line interface circuit. It will be understood that the roles of the two devices as transmitter and receiver can be reversed. The transmission driver circuits of devices 210 and 220 are not necessary the same.

Local device 210 includes I/O circuit 230, which interfaces with transmission line 240 via pad 212. Circuit 230 includes driver 232, which drives transmission line 240 for communication to remote device 220. In one embodiment, transmission line 240 is a signal line (e.g., trace) connecting I/O pins of local device 210 with remote device 220. Transmission line 240 could alternatively be a wire or other interconnection.

In one embodiment, driver 232 is a CMOS (complementary metal oxide semiconductor) structure, with a circuit equivalent of a pull-up element and a pull-down element. Either or both of the pull-up and pull-down legs of driver 232 can be connected to a respective voltage reference via a voltage regulator. In one embodiment, a voltage regulator is provided in the pull-up leg. In one embodiment, a voltage regulator is provided in the pull-down leg. In one embodiment, voltage regulators are provided in both the pull-up and pull-down legs. For example, a pull-up leg can be connected to VDD via voltage regulator (VR) 234, and a pull-down leg can be connected to VSS via VR 236. Thus, the effective logic high value for transmission by local device 210 can be VDD-$V_{VR234}$ or VDD minus a voltage step-down provided by VR 234. The effective logic low value for transmission by local device 210 can be VSS+$V_{VR236}$ or VSS plus a voltage step-up provided by VR 236. It will be understood that the voltage change provided by VR 234 and VR 236 are not necessarily the same. In both cases, the voltage swing would be reduced from the equivalent circuit without a voltage regulator.

The reduction in output voltage swing can provide power savings for circuit 230 as compared to a design that swings from rail to rail. Assume that VR 234 is included in circuit 230, providing an output voltage of VDD-$V_{VR234}$. If VR 234 is a linear voltage regulator, the design of system 200 will reduce transmit power in a linear relationship to the voltage reduction provided by $V_{VR234}$. If VR 234 is designed as a switching voltage regulator or switched circuit regulator (e.g., a switched capacitor regulator, switched inductor regulator), the design of system 200 can reduce transmit power in nearly a quadratic relationship to the voltage reduction provided by $V_{VR234}$. In one embodiment, as described in more detail below with respect to FIGS. 4 and 5, the exact swing target for one or both voltage regulators can be optimized after production of the actual physical device by using training flows from a test system that can seek to reduce total power while maintaining certain eye height and/or eye width goals.

In one embodiment, one or both voltage regulators 234 and 236 can be locally integrated on the same semiconductor die or integrated circuit as circuit 230, with very low area overhead. For example, a device design often has enough whitespace to accommodate implementation of a voltage regulator in circuit 230. There are known techniques to design linear regulators that can achieve low overhead power without requiring a significant amount of on die decoupling capacitance. In one embodiment, one or both voltage regulators 234 and 236 are implemented on the same package or the same board as circuit 230, without being on the same semiconductor substrate. Putting the voltage regulators off-die may impose higher design and/or implementation costs.

In one embodiment (not explicitly shown), one or both voltage regulators 234 and 236 can be selectively bypassed via a bypass path. The bypass path can be selectively activated to switch connecting to a voltage reference through the voltage regulator or connecting to the voltage reference directly. Thus, for example, the input to the regulator and the output of the regulator can be coupled through a selective (e.g., switched) low impedance path that will bypass the regulator when activated. Such a design could be used to interface with different types of systems (e.g., interfacing with both LPDDR3 (bypassed for full swing) and LPDDR4 (activated regulator for low swing)). Additionally, the voltage regulator could be switched off when not needed, such as for receiving a signal instead of driving transmission of a signal. Thus, in low power states, the voltage regulator can double as a power gate and shut off power to the driver when not in use, which can reduce circuit leakage.

Figure 3A:
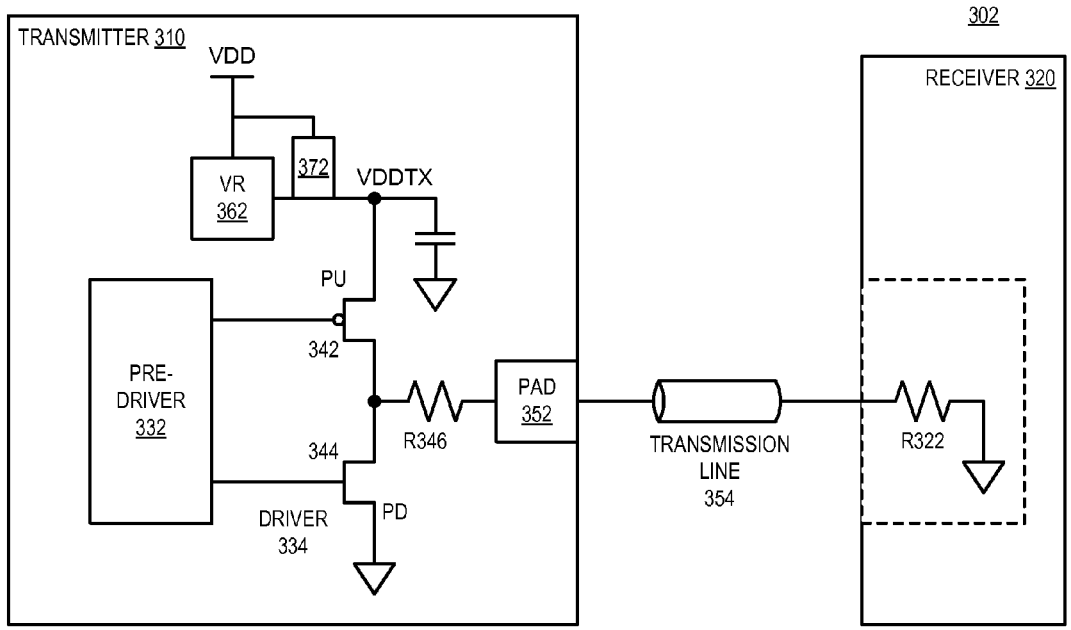
FIG. 3A is a block diagram of an embodiment of a system having a voltage regulator coupled to reduce a swing with respect to a high voltage reference of an output signal.

FIG. 3A is a block diagram of an embodiment of a system having a voltage regulator coupled to reduce a swing with respect to a high voltage reference of an output signal. System 302 can be one example of an embodiment of system 200. Transmitter 310 is the local device, and receiver 320 is the remote device. For purposes of transmit, receiver 320 is represented in system 302 as a load impedance R2322. Transmitter 310 includes predriver 332 to provide control and signaling for driver 334 to drive an output or transmit signal on transmission line 354 via pad 352.

Driver 334 includes pull-up element 342 and pull-down element 344. Element 344 is an n-type (e.g., NMOS) element that pulls down transmission line 354 to generate a logic low signal. Element 342 is a p-type (e.g., PMOS) element that pulls up transmission line 354 to generate a logic high signal. It will be understood that "logic low" and "logic high" refer to the voltage levels, not the communication protocol or signaling used between devices 310 and 320. For example, in one signaling scheme, a logic low can correspond to transmitting a "zero" and a logic high can correspond to transmitting a "one." However, the signaling scheme could be inverted, where a logic high can correspond to transmitting a zero and a logic low can correspond to transmitting a one.

Transmitter 310 includes voltage regulator 362 to lower the transmit high voltage level from VDD to VDDTX, which is VDD minus the voltage drop of voltage regulator 362. In one embodiment, transmitter 310 includes bypass path 372, which allows bypassing voltage regulator 362. A smoothing capacitor can be placed from VDDTX to VSS to filter noise that might be introduced by voltage regulator 362. Driver 334 includes output impedance, Ron, R346 coupled between complementary output elements 342 and 344 and pad 352. The design of system 302 provides a well-controlled Ron and output voltage levels. Additionally, the output voltage levels can be tunable by adjusting the output of voltage regulator 362.

System 302 can be used as an implementation of an LPDDR4 low swing VSS termination scheme. Additionally, system 302 can be implemented for both LPDDR3 and LPDDR4, for example, by selectively bypassing voltage regulator 362. Thus, system 302 supports a high performance combination LPDDR3/4 design. In one embodiment, bypass path 372 is part of or implemented by voltage regulator 362, to allow the regulator to short VDD to VDDTX. Those skilled in the art will appreciate that the design of system 302 will not impact the padcap or overall performance of transmitter 310.

The use of the CMOS buffer provides inherent signal integrity advantages by presenting a constant impedance of Ron to pad 352. Thus, transmitter 310 can match the characteristic impedance of transmission line 354 and absorb any excess energy due to reflections. However, by adjusting the target voltage of voltage regulator 362, system 302 can adjust the swing presented to receiver 320 to achieve the desired swing or common mode voltage. As a result, system 302 provides independent control over the I/O buffer swing and Ron.

Figure 3B:
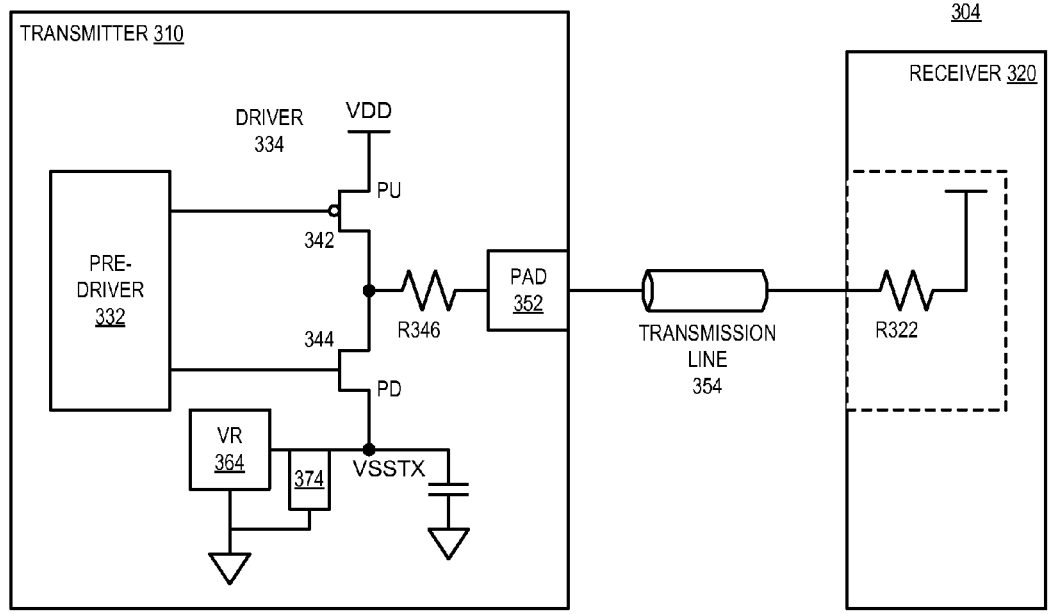
FIG. 3B is a block diagram of an embodiment of a system having a voltage regulator coupled to reduce a swing with respect to a low voltage reference of an output signal.

FIG. 3B is a block diagram of an embodiment of a system having a voltage regulator coupled to reduce a swing with respect to a low voltage reference of an output signal. System 304 can be one example of an embodiment of system 200. Transmitter 310 is the local device, and receiver 320 is the remote device. For purposes of transmit, receiver 320 is represented in system 304 as a load impedance R322, which can terminate to VDD, a common mode voltage, or to ground, depending on the specific implementation. Transmitter 310 includes predriver 332 to provide control and signaling for driver 334 to drive an output or transmit signal on transmission line 354 via pad 352. Driver 334 includes pull-up element 342 and pull-down element 344. Element 344 is an n-type (e.g., NMOS) element that pulls down transmission line 354 to generate a logic low signal. Element 342 is a p-type (e.g., PMOS) element that pulls up transmission line 354 to generate a logic high signal.

Transmitter 310 includes voltage regulator 364 to raise the transmit low voltage level from VSS to VSSTX, which is VSS plus the voltage of voltage regulator 364. In one embodiment, transmitter 310 includes bypass path 374, which allows bypassing voltage regulator 364. A smoothing capacitor can be placed from VSSTX to VSS (or to VDD depending on the environment) to filter noise that might be introduced by voltage regulator 364. Driver 334 includes output impedance, Ron, R346 coupled between complementary output elements 342 and 344 and pad 352. The design of system 304 provides a well-controlled Ron and output voltage levels. Additionally, the output voltage levels can be tunable by adjusting the output of voltage regulator 364.

Figure 3C:
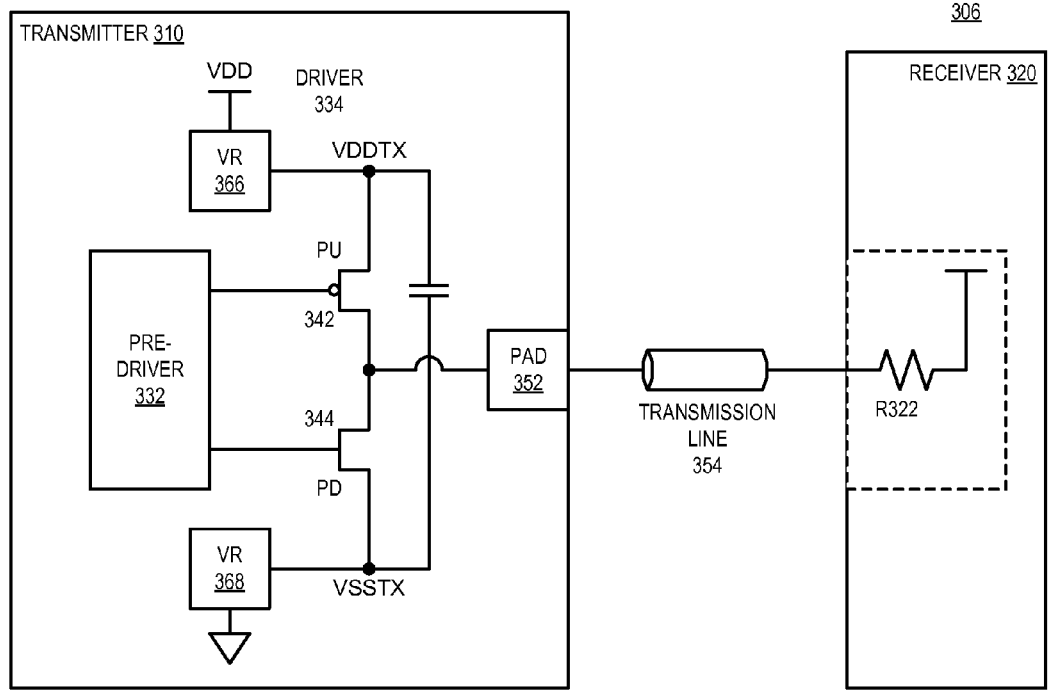
FIG. 3C is a block diagram of an embodiment of a system having voltage regulators coupled to reduce swing both with respect to a low voltage reference and a high voltage reference of an output signal.

FIG. 3C is a block diagram of an embodiment of a system having voltage regulators coupled to reduce swing both with respect to a low voltage reference and a high voltage reference of an output signal. System 306 can be one example of an embodiment of system 200. Transmitter 310 is the local device, and receiver 320 is the remote device. For purposes of transmit, receiver 320 is represented in system 306 as a load impedance R322, which can terminate to a common mode voltage or VDD. Transmitter 310 includes predriver 332 to provide control and signaling for driver 334 to drive an output or transmit signal on transmission line 354 via pad 352. Driver 334 includes pull-up element 342 and pull-down element 344. Element 344 is an n-type (e.g., NMOS) element that pulls down transmission line 354 to generate a logic low signal. Element 342 is a p-type (e.g., PMOS) element that pulls up transmission line 354 to generate a logic high signal.

Transmitter 310 includes voltage regulator 366 to lower the transmit high voltage level from VDD to VDDTX, which is VDD minus the voltage drop of voltage regulator 366. In one embodiment, transmitter 310 includes a bypass path to bypass voltage regulator 366 (not explicitly shown). Transmitter 310 also includes voltage regulator 368 to raise the transmit low voltage level from VSS to VSSTX, which is VSS plus the voltage of voltage regulator 368. In one embodiment, transmitter 310 includes a bypass path to bypass voltage regulator 368 (not explicitly shown). A capacitor can be placed between VDDTX to VSSTX to filter noise the output signal. Driver 334 is not explicitly shown to include an output impedance, but output impedance can be provided. The output voltage levels of driver 334 can be adjusted both with respect to the high voltage and the low voltage.

System 306 can be used as an implementation of a WIDEIO output driver, as well as an LPDDR3 output driver, and is applicable to any I/O where the swing is referenced to VDD/2. With WIDEIO, known designs swing pad 352 the entire rail (VSS to VDD). With LPDDR3, the receiver expects a common mode of VDD/2. The driver consumes a power equal to $CV^2F$ (where C is the capacitance, V is the voltage, and F is the frequency of the signal). Standards by JEDEC, such as the specification for LPDDR3 and the proposed specification for WIDEIO, allow for a pad swing from approximately 0.2*VDD to 0.8*VDD to be within required tolerances. However, known designs swing the full rail. If voltage regulators 366 and 368 were set to 20% of VDD, the output swing would still comply with standards, while reducing power consumption by 40% compared to swinging from 0 to VDD. Alternatively, voltage regulators 366 and 368 could be set to different values, and do not necessarily need to be set to an equal voltage step. It will be understood that voltage regulators 366 and 368 can be configured to operate symmetrically (e.g., adjusting the voltage swing by an equal amount) to preserve a common mode of VDD/2 for receiver 320.

In an implementation for WIDEIO, the receiver circuit is generally implemented as a simple inverter. Thus, the leakage power consumption increases exponentially when pad 352 does not swing the full rail. The use of bypass paths to pull pad 352 to a voltage reference rail (VDD or VSS) during idle periods can reduce leakage power consumption. During high activity periods where $CV^2F$ power dominates, system 306 can adjust the output voltage swing down to save power. During idle periods where leakage power dominates, system 306 can bypass the voltage regulators to cause pad 352 swings the full rail, which will reduce or eliminate the leakage. In one embodiment, the bypass paths can be implemented as weak pullup/pulldown paths to pull pad 352 to VDD/VSS during idle periods. In general, a bypass path can be implemented as either a low impedance path to cause the transmit voltage to equal the reference voltage instead of having the voltage regulator offset, or as a high impedance path (e.g., a power gate).

In any embodiment of any of FIG. 3A, 3B, or 3C, a test system could additionally be added to program the output voltage swing based on the specific production device (e.g., adjusting the operation of a device in-field). Thus, the exact target values of VSSTX and/or VDDTx can be tuned by the test system based on evaluation of eye height and/or eye width for power. A non-symmetrical value of VSSTX and VDDTX could allow the system to equalize the high and low side voltage margins while further reducing power. Such techniques are further described below.

Figure 4:
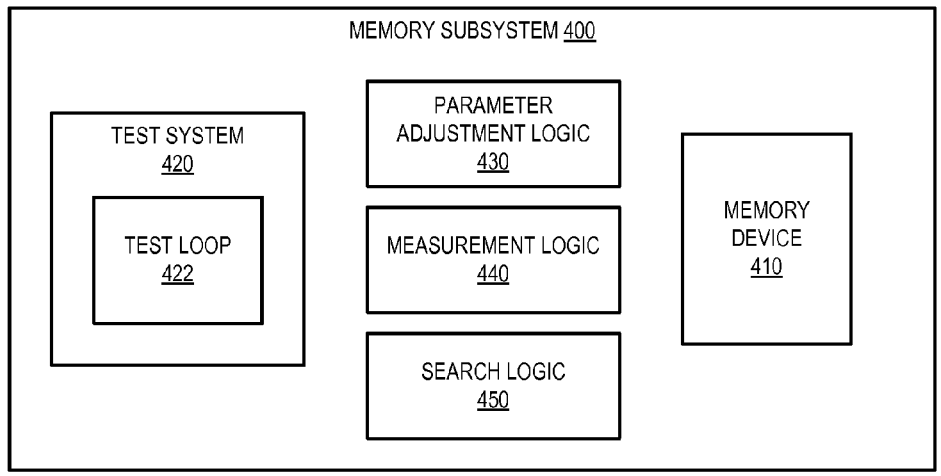
FIG. 4 is a block diagram of an embodiment of a memory subsystem having a test system that provides testing in-system to control output voltage swing.

FIG. 4 is a block diagram of an embodiment of a memory subsystem having a test system that provides testing in-system to control output voltage swing. A specific output voltage swing can be computed for a specific device in operation to determine tradeoffs between eye height and/or eye width and total power. While memory subsystem 400 is specifically illustrated, it will be understood that another electronic device subsystem that utilizes inter-device communication could equally be used. Memory subsystem 400 can include memory device 410, test system 420, parameter adjustment logic 430, measurement logic 440, and search logic 450. Such functional logic can refer to hardware, software, firmware, or a combination. Functional logic can also be implemented directly within an SoC (system on a chip) or could be remote and communicate over a separate I/O interface.

Memory device 410 represents one or more storage devices in the memory subsystem. Test system 420 provides testing of communication with memory device 410 to determine how to set I/O operating parameters with respect to communicating with memory device 410. Among other I/O operating parameters, test system 420 can determine specific voltage regulator settings to reduce a voltage swing of the output to the specific memory device 410 (or other receiving device from a transmitting device). In one embodiment, test system 420 includes test loop 422, which represents a loop to perform the testing. In particular, in one embodiment, testing and measurement are performed iteratively in loop 422 to determine how memory device 410 performs under a variety of conditions. In one embodiment, test system 420 includes extrapolation logic (not explicitly shown), which can be used to extrapolate performance (e.g., worst-case performance) of memory device 410 based on a number of measurements for different parameter settings. In one embodiment, test system 420 includes correlation logic (not specifically shown), which can be used to correlate multiple test results with each other to reduce or compensate for noise in the test results.

Parameter adjustment logic 430 represents logic to change a performance parameter. In one embodiment, logic 430 represents logic that adjusts a voltage regulator value or adjusts a voltage reference to memory device 410. The voltage regulators can include variable output circuits to provide a variable voltage to adjust the output voltage swing in response to control logic. In one embodiment, logic 430 represents logic that adjusts one or more latency parameters. For example, logic 430 could adjust electrical parameters such as Ron (output impedance), Rodt (on die termination impedance), slew rate, equalization, timing centering between data strobes, frequency, or other electrical parameters. In one embodiment, logic 430 represents logic that adjusts one or more frequency parameters. For example, logic 430 could adjust parameters related to any of the latency parameters above or other timing parameters, turnaround time, or other I/O parameters. The latency and/or frequency can affect a setting for a voltage regulator.

In one embodiment, parameter adjustment logic 430 is part of a memory controller, and affects configuration settings within the memory controller that control the delays. In one embodiment, logic 430 exists outside the memory controller, such as in a test engine close to the memory controller. In one embodiment, logic 430 causes the memory controller to adjust settings in the memory device itself, such as by setting configuration options. In one embodiment, parameter adjustment logic 430 can adjust the frequency at which the memory subsystem runs with fine granularity step size. Test system 420 determines operating settings specific to memory subsystem 400 based on the testing. In memory subsystem 400, the output drivers exist within the memory controller, and include voltage regulator(s) to adjust the voltage swing in accordance with any embodiment described herein.

Measurement logic 440 represents logic that measures one or more indicators of performance. For example, logic 440 can measure a signal eye width, a signal eye height, or both. In one embodiment, logic 440 measures a two dimensional version of eye height/eye width by measuring at angles other than 0 or 90 degrees. In one embodiment, logic 440 measures power consumption by memory subsystem 400. It will be understood that settings are adjusted by parameter adjustment logic 430 in accordance with the granularity of measurement of measurement logic 440 (i.e., change a parameter setting enough to make a detectable difference). Search logic 450 represents logic that determines from measured values what settings to use for I/O with memory device 410. In one embodiment, measurement logic 440 is used to generate one or more representative performance curves for the specific memory subsystem 400 under test. Based on the representative curves, search logic 450 can perform a search function to determine what settings to use to satisfy better performance for at least one parameter, while at least maintaining required (by standard or configuration) performance for the others. Search logic 450 can include any of n-dimensional search logic, 1-dimensional search logic (to perform n 1-dimensional searches), linear fit search logic, quadratic fit search logic, steepest descent search logic, curve fitting search logic, or others. It will be understood that n represents an integer indicating the number of independent parameters to search. Search logic 450 can also combine multiple measurements together to either reduce repeatability noise or extrapolate to worst case conditions. In one embodiment, an administrator can determine which consideration (I/O power, I/O frequency, or I/O latency) is the most significant characteristic for a system deployment of memory subsystem 400 and run test operations to improve that particular target characteristic.

I/O power refers to power used to send communication between devices, and makes up a significant amount of power consumption in many electronic devices. I/O latency affects how long it takes to access a memory device for an access transaction. Lower I/O latency can result in faster access, and thus increased performance in the system due to obtaining data faster. I/O frequency affects how long it takes to access a memory device for an access transaction. Higher I/O frequency can result in higher bandwidth, and thus increased performance in the system due to obtaining data faster. Higher bandwidth allows more operations in a given period of time, which can allow a data limited system to operate at higher performance. It can also reduce power by decreasing the amount of time the I/O is active, and increasing the amount of time the I/O is in a low power state.

Currently, the performance of a device with respect to I/O power, I/O latency, and I/O frequency is governed by fixed value settings that ensure functionality at a particular DPM (defect per million) level but do not achieve the lowest possible operating I/O latency for an individual, specific device. In one embodiment, as described herein, the test system empirically tests and determines settings that can set operating power, latency, and/or frequency for a specific device, while still maintaining DPM goals. Each setting can affect or be affected by a level at which a voltage regulator should be set to provide reduced output swing. Test system 420 can empirically test what settings to use for a voltage regulator, while achieving desired performance for the different metrics of communication.

For any target I/O performance characteristic (e.g., I/O power, I/O latency, I/O frequency), the test system can adjust any number of I/O circuit parameters that affect the target performance characteristic. The test system can adjust the frequency, for example, by using a fractional-N divider in a PLL (phase locked loop) circuit, which can adjust the frequency only for the memory subsystem, instead of for the computing device as a whole. Other methods to adjust the memory subsystem frequency will also be understood by those skilled in the art of overclocking systems. The test system then measures one or more operating margins (e.g., timing, maximum frequency, and/or voltage) across each setting. The test system performs a search based on the measured values to identify settings that maintain minimum requirements (e.g., settings that allow the device to satisfy DPM requirements), while improving performance of the target performance characteristic. The operations of the test system could be said to "optimize" the system. It will be understood that "optimize" does not necessarily refer to an absolute best performance possible. Optimizing can refer instead to improving or maximizing performance with respect to certain conditions, or in specific circumstances, or within certain constraints.

The testing provides stress on the memory device from the perspective of one or more performance parameters of interest, as provided by the examples above. It will be understood that other performance parameters could be evaluated by a test system. From one perspective, the memory device and memory subsystem (or other subsystems) are specifically tested in-system to determine whether the subsystem can be operated beyond the specification or standard applicable to the memory subsystem and memory device with respect to the I/O. The testing can be performed based only on the system itself, without the need for outside test equipment.

Regarding the testing, a test system as referred to herein includes hardware elements located in and/or near the memory controller (e.g., on a shared die space, on a SoC (system on a chip)) or other target device whose I/O performance is to be controlled with voltage regulators to reduce the output swing. The test system can create precise combinations of I/O (input/output) that result in I/O-induced power supply noise, inter-symbol interference (ISI), signal crosstalk, and/or other conditions. Any of these effects can be created by precisely controlling the data on each I/O lane, the pattern on each command lane, and/or how the data signals align with each other across lanes.

Figure 5:
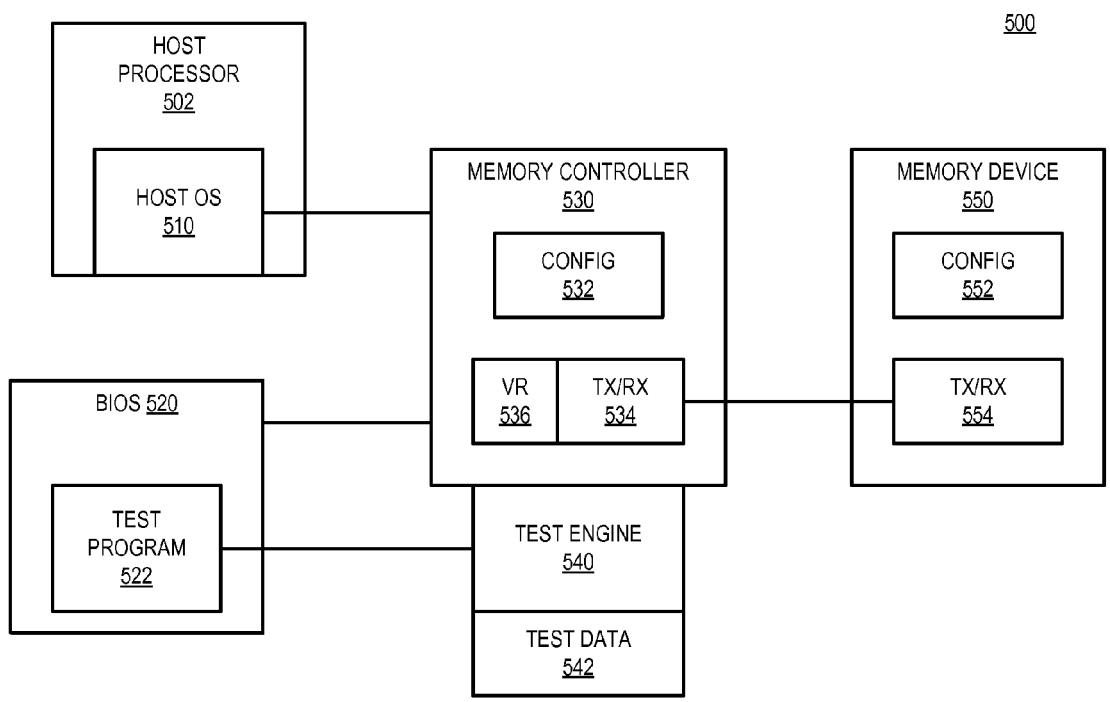
FIG. 5 is a block diagram of an embodiment of a memory controller and memory device communication subsystem with voltage regulation to control signal swing.

FIG. 5 is a block diagram of an embodiment of a memory controller and memory device communication subsystem with voltage regulation to control signal swing. In one embodiment, system 500 includes a memory subsystem including memory controller 530 and memory device 550. System 500 represents a production system, or a system in which memory device 550 is placed to be used by a consumer. System 500 includes a hardware platform (not explicitly shown) on which host processor 502 resides, as well as the memory subsystem including memory controller 530 and memory device 550. BIOS (basic input/output system) 520 or equivalent firmware for initializing the system, including the memory subsystem, also resides on the hardware platform.

Host processor 502 executes, among other things, host operating system (OS) 510. Host OS 510 generally provides operational control of system 500 during runtime. Host OS 510 provides software to hardware and hardware to software interfaces to allow a user to interact with system 500. BIOS 520 provides start-up control over system 500 until host OS 510 is loaded.

Host OS 510 provides memory access requests to memory controller 530 for access to memory device 550 for read and/or write of data. Similarly, BIOS 520 can provide memory access requests to memory controller 530. Memory controller 530 accesses memory device 550 in response to data access requests. In one embodiment, test engine 540 generates data access requests and/or access transactions for memory controller 530 to send to memory device 550. In one embodiment, test engine 540 can directly provide test data to memory device 550.

In one embodiment, BIOS 520 initiates a test via test program 522, and accesses test engine 540 to generate test data 542 to test communication with memory device 550 via memory controller 530. In one embodiment, test data 542 represents data stored during monitoring of testing memory device 550, such as data that is used to identify performance of memory device 550 under different parameter settings. In response to identifying the performance of the memory device, system 500 can dynamically set the operating parameters for I/O with memory device 550. Dynamically setting the operating parameters allows the system to set performance in accordance with a specific device, rather than using standard or default settings generally applicable to all devices. In this way, a specific system is not limited to the performance of the worst case possible system.

In one embodiment, configuration 552 represents a mechanism within memory device 550 such as a register or other configuration mechanism that stores I/O settings for TX/RX 554. TX/RX 554 represents transmit and receive circuits of memory device 550 that control the I/O performance of memory device 550. VR 536 represents one or more voltage regulators used to control the output swing of TX/RX 554. In one embodiment, configuration 532 represents a mechanism at memory controller 530 that stores I/O settings for TX/RX 534. TX/RX 534 represents transmit and receive circuits of memory controller 530 that control the I/O performance to memory device 550. Configuration 532 can also store settings for VR 536, to adjust the output swing of TX/RX 534. It will be understood that other components can also be connected to memory device 550 via TX/RX circuits, and would have similar configuration mechanisms.

Configuration 532 and 522 can include settings for the transmit and receive functions. For example, various settings can be applied to control timing, power, output voltage levels, voltage regulator levels, output impedance, slew rate, or other transmit parameters. On the receive side, on die termination (ODT), amplifier gain, equalization, and other receiver parameters can be controlled via various settings. Test engine 540 can perform tests at various different settings of the transmit and receive parameters, make measurements, and determine operating margins for the system (e.g., how the system performs compared to required minimum performance). The operating margins can be determined, for example, by having a minimum threshold (which in one embodiment includes a guard band) for various performance characteristics. Thus, determining operating margins can include determining actual performance compared to the thresholds. The thresholds can be dynamically calculated based on multiple measurements at different operating voltages, temperatures, or test, and extrapolated to worst case conditions. Additionally, one or more thresholds can be different for each of the different operating margins that are tested.

In one embodiment, system 500 is configured to reduce I/O power, in which case configuration 532 and 522 include at least the ability to change I/O circuit parameters that affect I/O power usage. Examples of the parameters include but are not limited to termination values, bias, slew rate, driver swing, driver impedance, and operating voltage (including a setting for VR 536). In such an embodiment, test engine 540 generates test content that stimulates the I/O with something having a known correlation to the worst case stimulus. Test engine 540 measures the operating voltage and/or timing margin for various circuit settings. Test engine 540 then analyzes the measured circuit parameter margin data (e.g., via a search function as described herein) and determines a lowest operating I/O power that still maintains the stated product DPM requirements for the parameters and settings tested and measured.

In one embodiment, system 500 is configured to increase I/O frequency, in which case configuration 532 and 522 include at least the ability to change I/O circuit parameters that affect I/O frequency. Examples of the parameters include but are not limited to termination values, bias, slew rate, current mode drivers, and operating voltage (including a setting for VR 536). Frequency parameters can be affected by components that can include but are not limited to DLLs (delay locked loops), PLLs (phase locked loops), and/or clock chips. In such an embodiment, test engine 540 generates test content that stimulates the I/O with something having a known correlation to the worst case stimulus. Test engine 540 measures the operating voltage, operating frequency, and/or timing margin for various circuit settings. Test engine 540 then analyzes the measured circuit parameter margin data (e.g., via a search function) and determines a highest operating I/O frequency that still maintains the stated product DPM requirements for the parameters and settings tested and measured.

In one embodiment, system 500 is configured to reduce I/O latency, in which case configuration 532 and 522 include at least the ability to change I/O circuit parameters that affect I/O latency. Examples of the parameters include but are not limited to turnaround values, FIFO (first-in, first-out buffer) pointers, round trip latency counters, termination values, bias, slew rate, and/or current mode drivers. In such an embodiment, test engine 540 generates test content that stimulates the I/O with something having a known correlation to the worst case stimulus. Test engine 540 measures the operating voltage and/or timing margin for various circuit settings. Test engine 540 then analyzes the measured circuit parameter margin data (e.g., via a search function as described herein) and determines a lowest operating I/O latency that still maintains the stated product DPM requirements for the parameters and settings tested and measured.

It will be understood that historically many or all of the operating parameters are set to static values for operation. In contrast, as described herein, test engine 540 tests and measures for parameter settings that increase performance of system 500. Test engine 540 performs a search function, which can include any one or more of many known search techniques. For example, quadratic fit, linear fit, n-dimensional search, n 1-dimensional searches, genetic search, steepest descent, curve fitting, or other techniques, or some combination can be used. The dimensions of the search depend on the manipulation of the settings of the parameters. In one embodiment, the n dimensions of the search include N parameters that affect both transmit and receive operation. In on embodiment, the n dimensions includes X transmit parameters by Y receiver parameters, where N is equal to the combination of unique X and Y parameters to test. Test engine 540 can run a test, measure the operating margin, test reliability, adjust the parameters, and repeat.

Figure 6A:
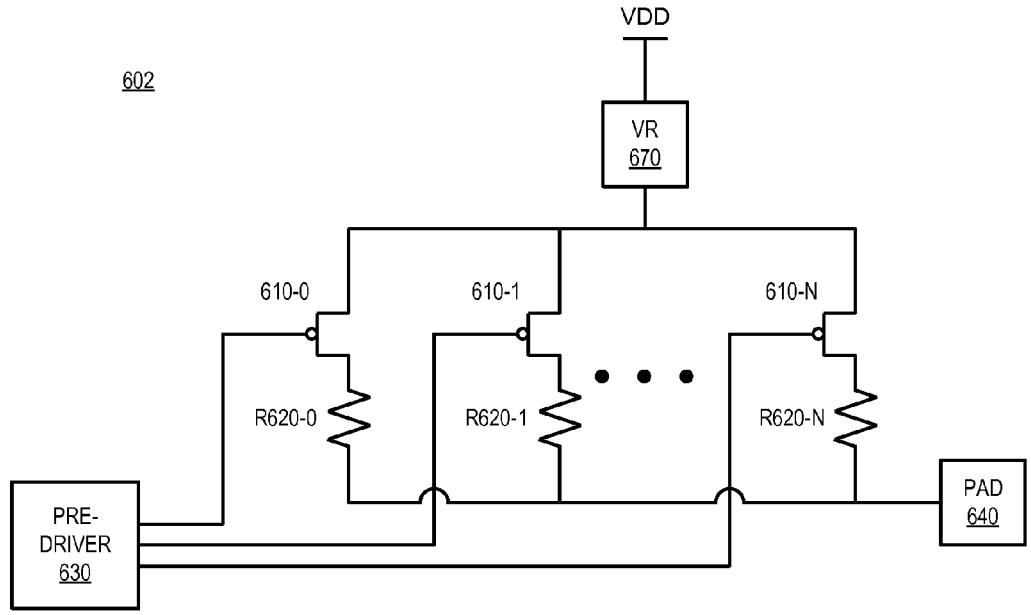
FIG. 6A is a block diagram of an embodiment of a multi-leg pull-up impedance circuit.

FIG. 6A is a block diagram of an embodiment of a multi-leg pull-up impedance circuit. In one embodiment, the output driver achieves different pull-up impedance by the use of switching in a different number of legs of a pull-up circuit or pull-up system. Pull-up circuit 602 includes N switches, 610-0 through 610-N, and a corresponding number of resistors, R620-0 through R620-N. Each combination of switch 610-n and resistor R620-n is a leg of pull-up circuit 602. Predriver 630 can select a number of legs to switch on to create the desired impedance. In one embodiment, each resistor is of roughly equivalent size (e.g., the same except for process variation), and desired number of resistors is turned on in parallel to give the desired impedance. In an alternative embodiment, one or more of the resistors has a different value, which can be selectively combined to adjust to a desired output impedance. It will be understood that all pull-up legs are connected in parallel to pad 640, which represents the output point for pull-up circuit 602. As illustrated, all pull-up legs can be coupled to VDD via VR 670, which represents voltage regulation components to adjust the maximum output voltage down from VDD to a lower value. VR 670 can be variable to allow adjustment of the output specific to a particular device in which circuit 602 is integrated.

Figure 6B:
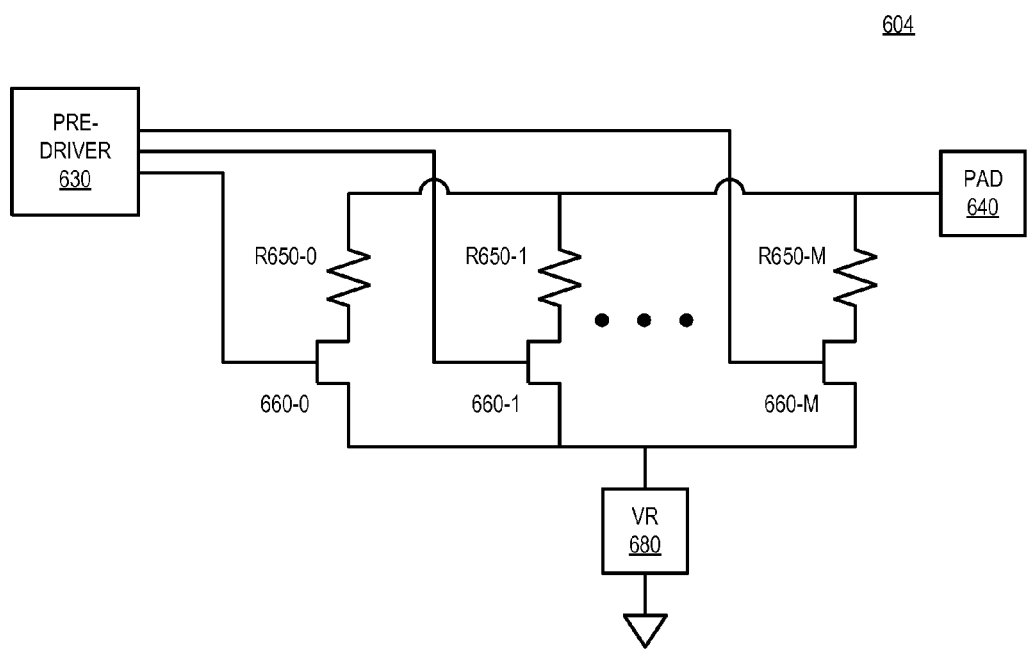
FIG. 6B is a block diagram of an embodiment of a multi-leg pull-down impedance circuit.

FIG. 6B is a block diagram of an embodiment of a multi-leg pull-down impedance circuit. In one embodiment, the output driver achieves different pull-down impedance by the use of switching in a different number of legs of a pull-down circuit or pull-down system. Pull-down circuit 604 includes M switches, 660-0 through 660-M, and a corresponding number of resistors, R650-0 through R650-M. Each combination of switch 660-m and resistor R650-n is a leg of pull-down circuit 604. In one embodiment, M is the same number as N. In one embodiment, there are a different number of pull-up legs and pull-down legs. As illustrated, all pull-down legs can be coupled to VSS via VR 680, which represents voltage regulation components to adjust the minimum output voltage up from VSS to a higher value. VR 680 can be variable to allow adjustment of the output specific to a particular device in which circuit 604 is integrated.

Predriver 630 can select a number of legs to switch on to create the desired impedance. In one embodiment, each resistor is of roughly equivalent size (e.g., the same except for process variation), and desired number of resistors is turned on in parallel to give the desired impedance. In an alternative embodiment, one or more of the resistors has a different value, which can be selectively combined to adjust to a desired output impedance. The individual pull-down resistors may or may not be the same value as the individual pull-up resistors. It will be understood that all pull-down legs are connected in parallel to pad 640, which represents the output point for pull-down circuit 604.

It is also understood that pull-up circuit 602 and pull-down circuit 604 are connected to pad 640. Traditional methods of achieving different impedances involved adding more legs to either or both of pull-down circuit 604 or pull-up circuit 602. However, adding more legs increases the pad capacitance (commonly referred to as PAD CAP or Cpad). Increasing the parasitic PAD CAP value can negatively affect timing and bandwidth performance. Additionally, adding more legs requires more circuitry/logic in predriver 630, which requires more power. Instead of adding more lower legs or pull-down legs, predriver 630 can selectively switch on a ratio of upper and lower legs to achieve a desired output impedance. Thus, different output impedance configurations can be achieved without increasing the number of legs in the system, which means that PAD CAP is unchanged and timing performance can be maintained.

It will be understood that the number of pull-up legs and/or pull-down legs to switch on depends on the system design, as well as a desired output impedance. A number of the pull-up legs switched on is different for a logic low and a logic high. In one embodiment, a number of pull-up legs can be turned on and left on for the entire time the driver drives the transmission line, with just the other upper legs and the lower legs being switched on and off to differentiate between a one and a zero, or a logic low and logic high. Thus, the predriver can switch on a ratio of upper and lower legs to generate an effective output impedance. In one embodiment, the ratio chosen is a ratio that causes an effective output impedance for a logic low to be the same as the effective output impedance for a logic high. The specific effective output impedance can affect a value used in VR 670 and/or VR 680 to set output thresholds on the output voltage swing.

Figure 7:
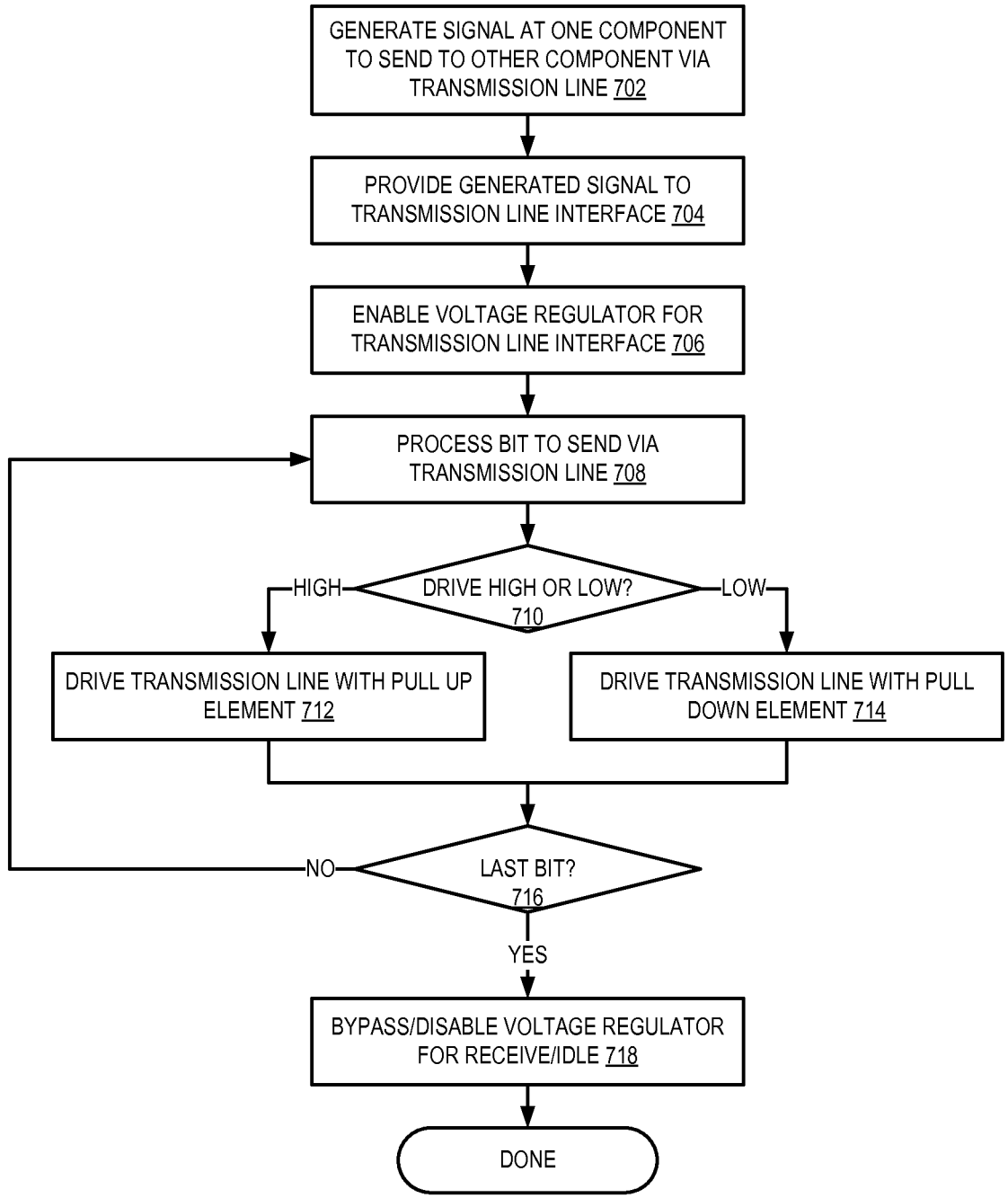
FIG. 7 is a flow diagram of an embodiment of a process for outputting a signal with a reduced voltage swing.

FIG. 7 is a flow diagram of an embodiment of a process for outputting a signal with a reduced voltage swing. In one embodiment, a component of a host platform generates a signal to send to another component via a transmission line, 702. The components interface via the transmission line, such as a trace or wire. The component that has a signal to send is the transmitter for purposes of the signal exchange, and the component to which it sends the signal is the receiver for purposes of the signal exchange. In one embodiment, the transmitter provides the generated signal to its serial output portion or transceiver, which can be or include a transmission line interface circuit, 704. The transmission line interface includes a driver to drive the signal on the transmission line. The driver drives the transmission line to a logic high and a logic low to provide the signal to the receiver.

The transmission line interface circuit includes a voltage regulator in the pull-up leg, or in the pull-down leg, or in both the pull-up and pull-down legs. In one embodiment, the voltage regulator(s) are selectively enabled, for example, enabled only to drive an output with the driver. If the voltage regulator(s) need to be enabled, the transmission line interface circuit enables the voltage regulator(s), 706.

The transmission line interface circuit processes the signal to determine a bit to send to the receiver via the transmission line, 708. If the driver is to drive a logic high, 710 HIGH branch, the transmission line interface circuit pulls the transmission line up with a pull-up element to a maximum transmission voltage, 712. The maximum transmission voltage is typically VDD in traditional circuits, and can be reduced by a voltage regulator between the pull-up element and VDD. If the driver is to drive a logic low, 710 LOW branch, the transmission line interface circuit pulls the transmission line with a pull-down element to a minimum transmission voltage, 714. The minimum transmission voltage is typically VSS in traditional circuits, and can be adjusted up by a voltage regulator between the pull-down element and VSS.

Whether a logic high or a logic low, after driving the bit, the transmission line interface circuit can determine if the last bit has been sent, 718. If the last bit has not been sent, 716 NO branch, the transmission line interface circuit processes the next bit, 708, and repeats the output process. If the last bit has been sent, 716 YES branch, the transmission line interface circuit can optionally bypass and/or disable the voltage regulator for a receiving or idle state, 718.

Figure 8:
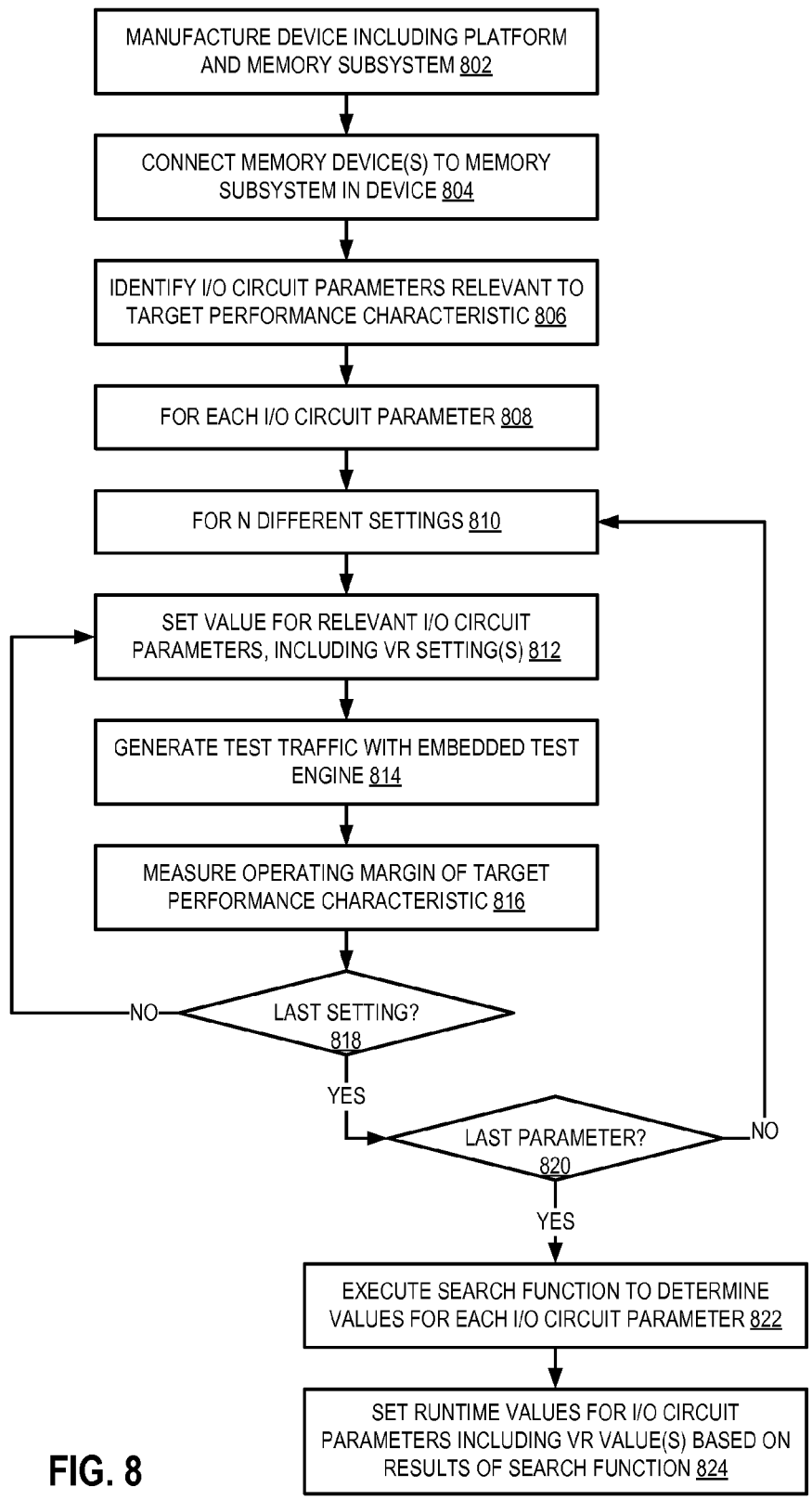
FIG. 8 is a flow diagram of an embodiment of a process for empirically testing and determining a communication setting using an exhaustive search of possible values.

FIG. 8 is a flow diagram of an embodiment of a process for empirically testing and determining a communication setting using an exhaustive search of possible values. While an example of a memory subsystem is provided, it will be understood that another subsystem where components exchange communication can be used instead of a memory subsystem. Thus, a memory subsystem is simply one example of a system in which devices communicate with each other where a voltage regulator can be used to control the output or transmission voltage swing. A manufacturer manufactures a device including a host hardware platform and a memory subsystem on the platform, 802. The same or a different entity (either a manufacturer or end user) can then connect one or more memory devices to the memory subsystem in the device, 804. One or more components on the platform (e.g., such as the memory controller) will perform I/O operations with the memory device.

A test engine or test system execute a test program to stress test the memory device(s) in-system to determine what settings to use for I/O circuits. The test system identifies I/O circuit parameters relevant to a target performance characteristic (e.g., power, timing), 806. The testing can be performed in accordance with any embodiment described herein. The test engine is embedded on the host platform, and does not require external test equipment to perform the testing. In one embodiment, a BIOS on the platform includes a test program or test routine to perform when memory is connected to the memory subsystem. The test program or routine directs the test engine to perform testing including measurement and analysis to determine a best setting for the specific system within the limits of what is tested. In one embodiment, the test engine is triggered from a location remote to the device including the memory device(s) to test, such as over a network connection.

In one embodiment, the test system iterates or loops through various test operations over each identified circuit parameter, 808. The test system can also loop through N different settings of any given parameter (where N is not necessarily the same for any of the number of parameters to be tested), 810. For each test iteration, the memory subsystem, at the control of the test program and/or test system, can adjust or set one or more values for relevant I/O circuit parameters, including voltage regulator settings to control the output voltage swing, 812.

In one embodiment, the test system generates test traffic with an embedded test engine, 814. The test content can consistent of a single or multiple tests that test for different marginalities in the design in a functional fashion at one or multiple environment conditions, such as voltage, temperature, frequency, or other conditions. In one embodiment, the test system then measures one or more operating margins of the target performance characteristic, 816. The test system repeats the testing and measuring for each different setting until the last setting is tested, 818 YES branch. In one embodiment, the test system iterates through each identified I/O parameter that can affect the I/O performance of interest until all parameters are tested, 820 YES branch. Until the last parameter is reached, 820 NO branch, the test engine continues iterating for each of the N different settings, 810. The test engine can use various different stress test patterns as described in more detail below, which patterns can include LFSR, victim-aggressor, crosstalk, ISI, power supply noise, power supply value, or other patterns.

In one embodiment, the test system executes a search function to determine value for each I/O circuit parameter to use in runtime operation of the system under test, 822. The determined values should be values at which each I/O circuit parameter meets a minimum threshold for the specific system, and improves performance of at least one of the I/O circuit parameters. The test system can then cause the system under test to set runtime values for the I/O circuit parameters based on results of the search function, 824. The runtime settings can be specifically determined by the search function, or the search function can identify a value and the system can set the runtime settings just above the determine value. In one embodiment, the search function adds an explicit guard band.

In one embodiment, the search function can extrapolate one or more measurements based on multiple tests or environment conditions to a worst case condition to minimize any guard band.

Figure 9:
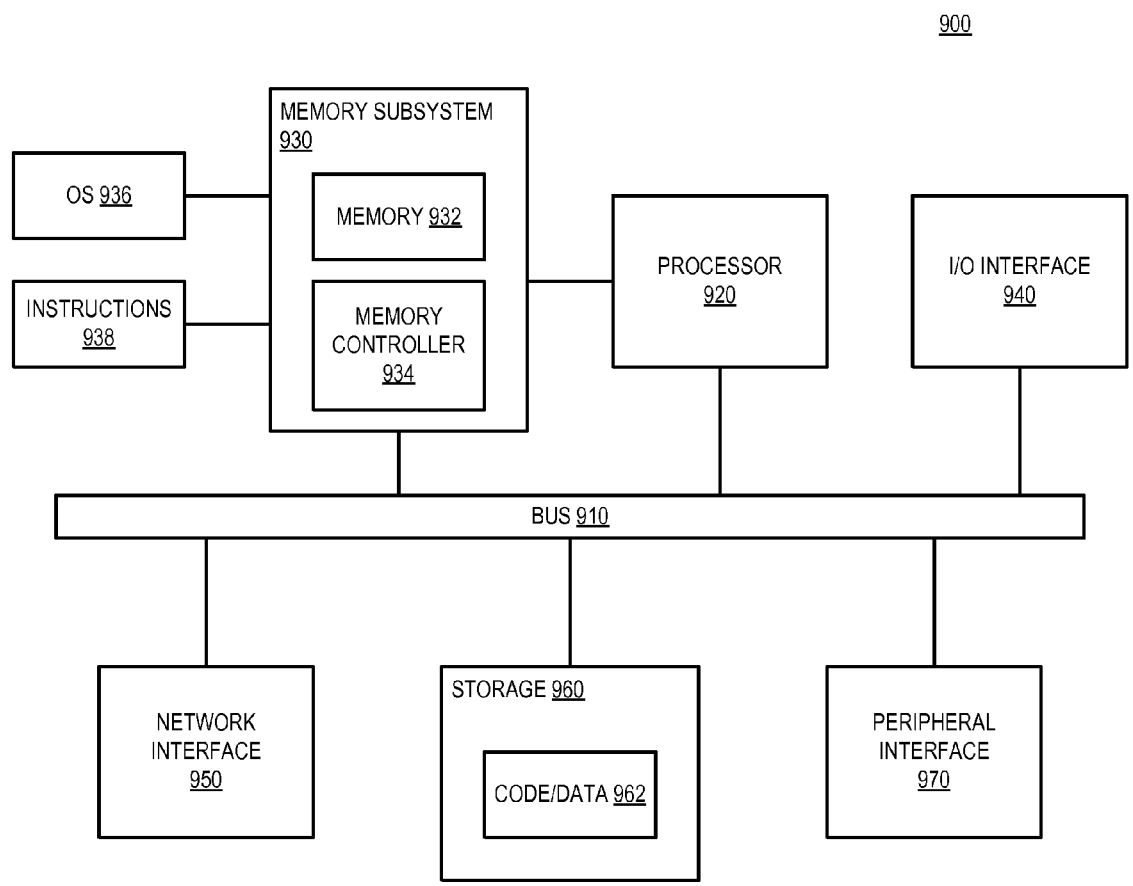
FIG. 9 is a block diagram of an embodiment of a computing system in which voltage swing control can be implemented.

FIG. 9 is a block diagram of an embodiment of a computing system in which voltage swing control can be implemented. System 900 represents a computing device in accordance with any embodiment described herein, and can be a laptop computer, a desktop computer, a server, a gaming or entertainment control system, a scanner, copier, printer, routing or switching device, or other electronic device. System 900 includes processor 920, which provides processing, operation management, and execution of instructions for system 900. Processor 920 can include any type of microprocessor, central processing unit (CPU), processing core, or other processing hardware to provide processing for system 900. Processor 920 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 930 represents the main memory of system 900, and provides temporary storage for code to be executed by processor 920, or data values to be used in executing a routine. Memory subsystem 930 can include one or more memory devices such as read-only memory (ROM), flash memory, one or more varieties of random access memory (RAM), or other memory devices, or a combination of such devices. Memory subsystem 930 stores and hosts, among other things, operating system (OS) 936 to provide a software platform for execution of instructions in system 900. Additionally, other instructions 938 are stored and executed from memory subsystem 930 to provide the logic and the processing of system 900. OS 936 and instructions 938 are executed by processor 920.

Memory subsystem 930 includes memory device 932 where it stores data, instructions, programs, or other items. In one embodiment, memory subsystem includes memory controller 934, which is a memory controller in accordance with any embodiment described herein, and which includes a scheduler to generate and issue commands to memory device 932.

In one embodiment, one or more components of system 900 include one or more voltage regulators used to control output voltage of a transmission line interface. The voltage regulator(s) can be selectively enabled, and will adjust the output or transmit voltage swing. In one embodiment, system 900 includes a test engine (not specifically shown), which can empirically test communication in-system, including testing a value setting for a voltage regulator.

Processor 920 and memory subsystem 930 are coupled to bus/bus system 910. Bus 910 is an abstraction that represents any one or more separate physical buses, communication lines/interfaces, and/or point-to-point connections, connected by appropriate bridges, adapters, and/or controllers. Therefore, bus 910 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 910 can also correspond to interfaces in network interface 950.

System 900 also includes one or more input/output (I/O) interface(s) 940, network interface 950, one or more internal mass storage device(s) 960, and peripheral interface 970 coupled to bus 910. I/O interface 940 can include one or more interface components through which a user interacts with system 900 (e.g., video, audio, and/or alphanumeric interfacing). Network interface 950 provides system 900 the ability to communicate with remote devices (e.g., servers, other computing devices) over one or more networks. Network interface 950 can include an Ethernet adapter, wireless interconnection components, USB (universal serial bus), or other wired or wireless standards-based or proprietary interfaces.

Storage 960 can be or include any conventional medium for storing large amounts of data in a nonvolatile manner, such as one or more magnetic, solid state, or optical based disks, or a combination. Storage 960 holds code or instructions and data 962 in a persistent state (i.e., the value is retained despite interruption of power to system 900). Storage 960 can be generically considered to be a "memory," although memory 930 is the executing or operating memory to provide instructions to processor 920. Whereas storage 960 is nonvolatile, memory 930 can include volatile memory (i.e., the value or state of the data is indeterminate if power is interrupted to system 900).

Peripheral interface 970 can include any hardware interface not specifically mentioned above. Peripherals refer generally to devices that connect dependently to system 900. A dependent connection is one where system 900 provides the software and/or hardware platform on which operation executes, and with which a user interacts.

Figure 10:
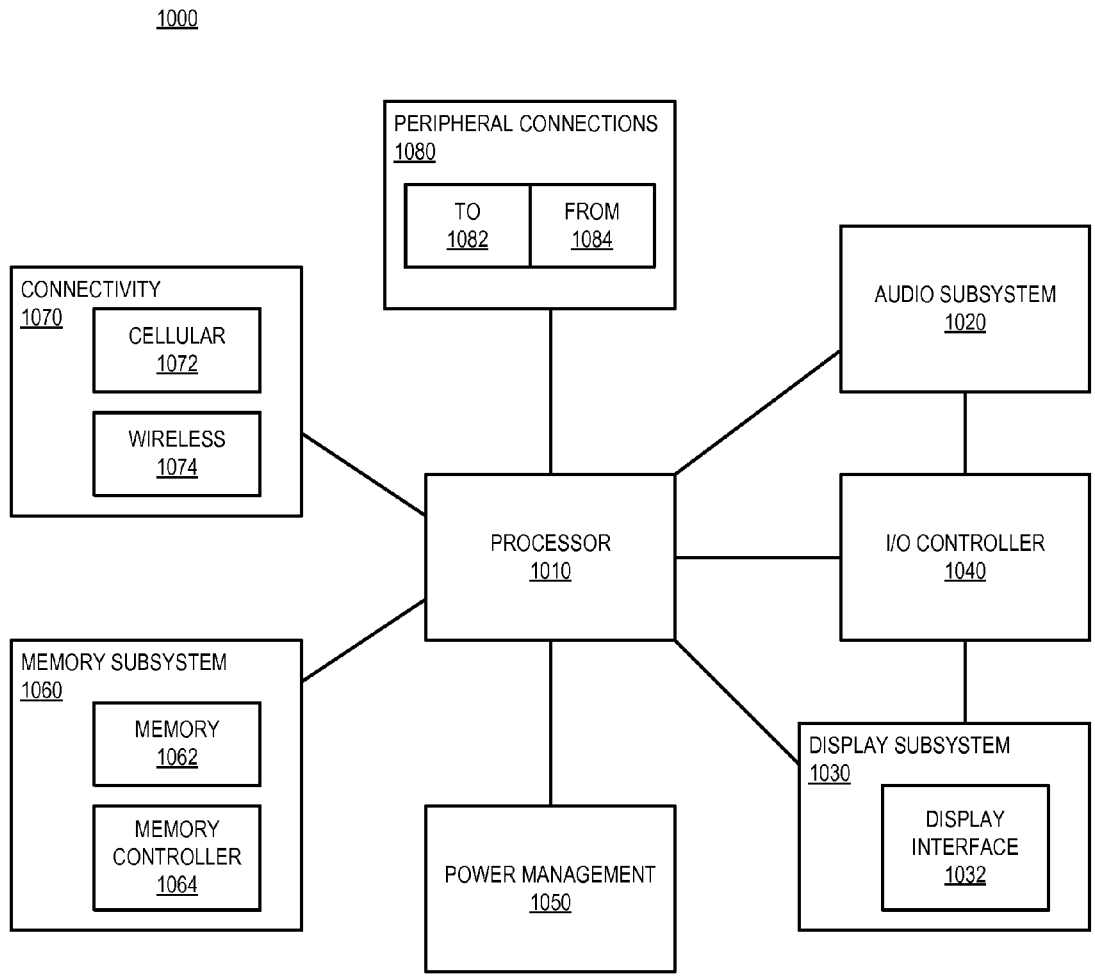
FIG. 10 is a block diagram of an embodiment of a mobile device in which voltage swing control can be implemented.

FIG. 10 is a block diagram of an embodiment of a mobile device in which voltage swing control can be implemented. Device 1000 represents a mobile computing device, such as a computing tablet, a mobile phone or smartphone, a wireless-enabled e-reader, or other mobile device. It will be understood that certain of the components are shown generally, and not all components of such a device are shown in device 1000.

Device 1000 includes processor 1010, which performs the primary processing operations of device 1000. Processor 1010 can include one or more physical devices, such as microprocessors, application processors, microcontrollers, programmable logic devices, or other processing means. In one embodiment, processor 1010 includes optical interface components in addition to a processor die. Thus, the processor die and photonic components are in the same package. Such a processor package can interface optically with an optical connector in accordance with any embodiment described herein.

The processing operations performed by processor 1010 include the execution of an operating platform or operating system on which applications and/or device functions are executed. The processing operations include operations related to I/O (input/output) with a human user or with other devices, operations related to power management, and/or operations related to connecting device 1000 to another device. The processing operations can also include operations related to audio I/O and/or display I/O.

In one embodiment, device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1000, or connected to device 1000. In one embodiment, a user interacts with device 1000 by providing audio commands that are received and processed by processor 1010.

Display subsystem 1030 represents hardware (e.g., display devices) and software (e.g., drivers) components that provide a visual and/or tactile display for a user to interact with the computing device. Display subsystem 1030 includes display interface 1032, which includes the particular screen or hardware device used to provide a display to a user. In one embodiment, display interface 1032 includes logic separate from processor 1010 to perform at least some processing related to the display. In one embodiment, display subsystem 1030 includes a touchscreen device that provides both output and input to a user.

I/O controller 1040 represents hardware devices and software components related to interaction with a user. I/O controller 1040 can operate to manage hardware that is part of audio subsystem 1020 and/or display subsystem 1030. Additionally, I/O controller 1040 illustrates a connection point for additional devices that connect to device 1000 through which a user might interact with the system. For example, devices that can be attached to device 1000 might include microphone devices, speaker or stereo systems, video systems or other display device, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of device 1000. Additionally, audio output can be provided instead of or in addition to display output. In another example, if display subsystem includes a touchscreen, the display device also acts as an input device, which can be at least partially managed by I/O controller 1040. There can also be additional buttons or switches on device 1000 to provide I/O functions managed by I/O controller 1040.

In one embodiment, I/O controller 1040 manages devices such as accelerometers, cameras, light sensors or other environmental sensors, gyroscopes, global positioning system (GPS), or other hardware that can be included in device 1000. The input can be part of direct user interaction, as well as providing environmental input to the system to influence its operations (such as filtering for noise, adjusting displays for brightness detection, applying a flash for a camera, or other features). In one embodiment, device 1000 includes power management 1050 that manages battery power usage, charging of the battery, and features related to power saving operation.

Memory subsystem 1060 includes memory device(s) 1062 for storing information in device 1000. Memory subsystem 1060 can include nonvolatile (state does not change if power to the memory device is interrupted) and/or volatile (state is indeterminate if power to the memory device is interrupted) memory devices. Memory 1060 can store application data, user data, music, photos, documents, or other data, as well as system data (whether long-term or temporary) related to the execution of the applications and functions of system 1000. In one embodiment, memory subsystem 1060 includes memory controller 1064 (which could also be considered part of the control of system 1000, and could potentially be considered part of processor 1010). Memory controller 1064 includes a scheduler to generate and issue commands to memory device 1062.

Connectivity 1070 includes hardware devices (e.g., wireless and/or wired connectors and communication hardware) and software components (e.g., drivers, protocol stacks) to enable device 1000 to communicate with external devices. The device could be separate devices, such as other computing devices, wireless access points or base stations, as well as peripherals such as headsets, printers, or other devices.

Connectivity 1070 can include multiple different types of connectivity. To generalize, device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (e.g., downloading and/or uploading, changing, synchronizing) content on device 1000. Additionally, a docking connector can allow device 1000 to connect to certain peripherals that allow device 1000 to control content output, for example, to audiovisual or other systems.

In addition to a proprietary docking connector or other proprietary connection hardware, device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, one or more components of system 1000 include one or more voltage regulators used to control output voltage of a transmission line interface. The voltage regulator(s) can be selectively enabled, and will adjust the output or transmit voltage swing. In one embodiment, system 1000 includes one or more test engines (not specifically shown), which can empirically test communication in-system, including testing a value setting for a voltage regulator.

In one aspect, a transmission line interface circuit includes multiple driver elements, including a p-type driver element coupled between a transmission line and a high voltage reference for the transmission line interface circuit, to pull up the transmission line in response to a logic high value of an input signal to be driven on the transmission line; and an n-type driver element coupled between the transmission line and a low voltage reference for the transmission line interface circuit, to pull down the transmission line in response to a logic low value of the input signal; and a voltage regulator coupled locally in the transmission line interface circuit between one of the driver elements and a respective voltage reference to reduce a voltage swing of the transmission line interface circuit.

In one embodiment, the voltage regulator comprises a linear voltage regulator. In one embodiment, the voltage regulator comprises a switched circuit voltage regulator. In one embodiment, the voltage regulator is integrated on a common integrated circuit with the transmission line interface circuit. In one embodiment, the voltage regulator is coupled between the p-type driver element and the high voltage reference. In one embodiment, the voltage regulator is a first voltage regulator, and the transmission line interface further includes a second voltage regulator coupled between the n-type driver element and the low voltage reference. In one embodiment, the transmission line interface further includes a bypass path selectively activated to bypass the voltage regulator to receive a signal on the transmission line. In one embodiment, the voltage regulator further includes control elements to receive a set value from a test circuit to configure an output of the voltage regulator to control the voltage swing of the transmission line interface circuit. In one embodiment, the multiple driver elements comprise output driver elements of a memory controller device to drive a pad that interconnects with a memory device. In one embodiment, the memory device comprises one of a low power dual data rate (LPDDR) memory device, a dual data rate (DDR) memory device, or a WIDEIO memory device.

In one aspect, an electronic device includes a host hardware platform including a processor; a memory controller device on the host hardware platform having a transmission line interface circuit to communicate with a memory device, the transmission line interface circuit including multiple driver elements, including a p-type driver element coupled between a transmission line and a high voltage reference for the transmission line interface circuit, to pull up the transmission line in response to a logic high value of an input signal to be driven on the transmission line; and an n-type driver element coupled between the transmission line and a low voltage reference for the transmission line interface circuit, to pull down the transmission line in response to a logic low value of the input signal; and a voltage regulator coupled locally in the transmission line interface circuit between one of the driver elements and a respective voltage reference to reduce a voltage swing of the transmission line interface circuit; and a touchscreen display coupled to generate a display based on data accessed by the memory controller device.

In one embodiment, the voltage regulator is integrated on memory controller device. In one embodiment, the voltage regulator is coupled between the p-type driver element and the high voltage reference. In one embodiment, the voltage regulator is a first voltage regulator, and the transmission line interface further includes a second voltage regulator coupled between the n-type driver element and the low voltage reference. In one embodiment, the memory controller device further includes a bypass path selectively activated to bypass the voltage regulator to receive a signal on the transmission line. In one embodiment, the transmission line interface further includes a test circuit coupled to the memory controller device to configure the voltage regulator to control the voltage swing of the transmission line interface circuit. In one embodiment, the memory device comprises a low power dual data rate (LPDDR) memory device.

In one aspect, a method includes receiving a signal to drive on a transmission line to a memory device; in response to receiving the signal, activating a voltage regulator coupled locally in a transmission line interface circuit between a driver element and a respective voltage reference to reduce a voltage swing of the transmission line interface circuit; and driving the transmission line high with a p-type driver element coupled between the transmission line and a high voltage reference for the transmission line interface circuit, in response to a logic high value of the input signal; and driving the transmission line low with an n-type driver element coupled between the transmission line and a low voltage reference for the transmission line interface circuit, in response to a logic low value of the input signal.

In one embodiment, activating the voltage regulator comprises activating a voltage regulator coupled between the p-type driver element and the high voltage reference. In one embodiment, the method further includes determining a voltage level at which to activate the voltage regulator, including for each of multiple different settings for multiple different I/O (input/output) circuit parameters for a target I/O performance characteristic of the transmission line interface circuit, setting a value for each I/O circuit parameter; generating test traffic for the setting; and measuring an operating margin for the I/O performance characteristic; executing a search function to determine values for each I/O circuit parameter at which the operating margin meets a minimum threshold, and performance of at least one of the I/O circuit parameters is increased; and setting runtime values for the I/O circuit parameters based on the search function.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A transmission line interface circuit comprising:
   multiple driver elements, comprising:
   a p-type driver element coupled between a transmission line and a high voltage reference for the transmission line interface circuit, the p-type driver element to pull up the transmission line in response to a logic high value of an input signal to be driven on the transmission line; and
   an n-type driver element coupled between the transmission line and a low voltage reference for the transmission line interface circuit, the n-type driver element to pull down the transmission line in response to a logic low value of the input signal; and
   a voltage regulator coupled locally in the transmission line interface circuit between one of the driver elements and a respective one of the high and low voltage references to reduce a voltage swing of the transmission line interface circuit, wherein an input of the voltage regulator is coupled to the respective one of the high and low voltage references and an output of the voltage regulator is coupled to the one of the driver elements such that the respective one of the drivers elements is current supplied primarily from the voltage regulator when the voltage regulator is utilized and,
   a bypass circuit coupled to the one of the driver elements and the respective one of the high and low voltage references to bypass the voltage regulator when the bypass circuit is activated.

2. The transmission line interface circuit of claim 1, wherein the voltage regulator comprises a linear voltage regulator.

3. The transmission line interface circuit of claim 1, wherein the voltage regulator comprises a switched-circuit voltage regulator.

4. The transmission line interface circuit of claim 1, wherein the voltage regulator is integrated on a common integrated circuit with the transmission line interface circuit.

5. The transmission line interface circuit of claim 1, wherein the voltage regulator is coupled between the p-type driver element and the high voltage reference.

6. The transmission line interface circuit of claim 5, wherein the voltage regulator is a first voltage regulator, and further comprising a second voltage regulator coupled between the n-type driver element and the low voltage reference.

7. The transmission line interface circuit of claim 1, the voltage regulator further comprising control elements to receive a set value from a test circuit to configure an output of the voltage regulator to control the voltage swing of the transmission line interface circuit.

8. The transmission line interface circuit of claim 1, wherein the multiple driver elements are output driver elements of a memory controller device to drive a pad that interconnects with a memory device.

9. The transmission line interface circuit of claim 8, wherein the memory device comprises one of a low power dual data rate (LPDDR) memory device, a dual data rate (DDR) memory device, or a WIDEIO memory device.

10. An electronic device comprising:
    a host hardware platform including a processor;
    a memory controller device on the host hardware platform having a transmission line interface circuit to communicate with a memory device, the transmission line interface circuit comprising:

multiple driver elements, comprising:
- a p-type driver element coupled between a transmission line and a high voltage reference for the transmission line interface circuit, the p-type driver element to pull up the transmission line in response to a logic high value of an input signal to be driven on the transmission line; and
- an n-type driver element coupled between the transmission line and a low voltage reference for the transmission line interface circuit, the n-type driver element to pull down the transmission line in response to a logic low value of the input signal; and
- a voltage regulator coupled locally in the transmission line interface circuit between one of the driver elements and a respective one of the high and low voltage references to reduce a voltage swing of the transmission line interface circuit, wherein an input of the voltage regulator is coupled to the respective one of the high and low voltage references and an output of the voltage regulator is coupled to the one of the driver elements such that the respective one of the drivers elements is current supplied primarily from the voltage regulator when the voltage regulator is utilized
- a bypass circuit coupled to the one of the driver elements and the respective one of the high and low voltage references to bypass the voltage regulator when the bypass circuit is activated; and,
- a touchscreen display coupled to generate a display based on data accessed by the memory controller device.

11. The electronic device of claim 10, wherein the voltage regulator is integrated on the memory controller device.

12. The electronic device of claim 10, wherein the voltage regulator is coupled between the p-type driver element and the high voltage reference.

13. The electronic device of claim 12, wherein the voltage regulator is a first voltage regulator, and further comprising a second voltage regulator coupled between the n-type driver element and the low voltage reference.

14. The electronic device of claim 10, further comprising:
- a test circuit coupled to the memory controller device to configure the voltage regulator to control the voltage swing of the transmission line interface circuit.

15. The electronic device of claim 10, wherein the memory device comprises a low power dual data rate (LPDDR) memory device.

16. A method comprising:
- configuring a bypass circuit that bypasses a voltage regulator to not be activated so that the voltage regulator is not bypassed;
- receiving a signal to drive on a transmission line to a memory device;
- in response to receiving the signal, activating the voltage regulator, the voltage regulator being coupled locally in a transmission line interface circuit between a driver element and a respective one of high and low voltage references to reduce a voltage swing of the transmission line interface circuit such that the drivers element is current supplied primarily from the voltage regulator when the voltage regulator is utilized; and
- driving the transmission line high with a p-type driver element coupled between the transmission line and the high voltage reference for the transmission line interface circuit, in response to a logic high value of the input signal; and
- driving the transmission line low with an n-type driver element coupled between the transmission line and the low voltage reference for the transmission line interface circuit, in response to a logic low value of the input signal wherein one of the p-type driver element and the n-type driver element is the driver element.

17. The method of claim 16, wherein activating the voltage regulator comprises activating a voltage regulator coupled between the p-type driver element and the high voltage reference.

18. The method of claim 16, further comprising determining a voltage level at which to activate the voltage regulator, including
- for each of multiple different settings for multiple different I/O (input/output) circuit parameters for a target I/O performance characteristic of the transmission line interface circuit,
    - setting a value for each I/O circuit parameter;
    - generating test traffic for the setting; and
    - measuring an operating margin for the I/O performance characteristic;
- executing a search function to determine values for each I/O circuit parameter at which the operating margin meets a minimum threshold, and performance of at least one of the I/O circuit parameters is increased; and
- setting runtime values for the I/O circuit parameters based on the search function.

\* \* \* \* \*